United States Patent
Cheng

(10) Patent No.: US 10,362,682 B2
(45) Date of Patent: Jul. 23, 2019

(54) MANUFACTURING METHOD OF CIRCUIT BOARD

(71) Applicant: Unimicron Technology Corp., Taoyuan (TW)

(72) Inventor: Shih-Lian Cheng, New Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 186 days.

(21) Appl. No.: 15/255,150

(22) Filed: Sep. 2, 2016

(65) Prior Publication Data

US 2017/0273186 A1    Sep. 21, 2017

Related U.S. Application Data

(60) Provisional application No. 62/309,930, filed on Mar. 17, 2016.

(51) Int. Cl.
*H05K 3/02* (2006.01)
*H05K 3/10* (2006.01)
(Continued)

(52) U.S. Cl.
CPC .......... *H05K 3/064* (2013.01); *G03F 7/0002* (2013.01); *G03F 7/162* (2013.01); *G03F 7/20* (2013.01);
(Continued)

(58) Field of Classification Search
CPC .. H05K 3/06; H05K 3/46; H05K 3/00; H05K 3/10; H05K 1/10; H05K 3/4602; H05K 1/186; H05K 2203/1147; H05K 3/4644; H05K 3/108; H05K 3/064; H05K 3/107; H05K 3/246; G03F 7/00; G03F 7/16; G03F 7/20; H01L 21/00; H01L 21/4867; H01L 2224/92244; Y10T 29/49155; Y10T 29/49128
(Continued)

(56) References Cited

U.S. PATENT DOCUMENTS 7,882,626 B2 * 2/2011 Murayama .......... H01L 21/4857
257/698
9,018,096 B2 * 4/2015 Price ................... H01L 21/7688
257/E21.586
(Continued)

FOREIGN PATENT DOCUMENTS

TW    200528924    9/2005
TW    201530374    8/2015

*Primary Examiner* — Thiem D Phan
(74) *Attorney, Agent, or Firm* — JCIPRNET

(57) ABSTRACT

A manufacturing method of a circuit board including the following steps is provided. A carrier substrate is provided. A patterned photoresist layer is formed on the carrier substrate. An adhesive layer is formed on the top surface of the patterned photoresist layer. A dielectric substrate is provided. A circuit pattern and a dielectric layer covering the circuit pattern are formed on the dielectric substrate, wherein the dielectric layer has an opening exposing a portion of the circuit pattern. The adhesive layer is adhered to the dielectric layer in a direction that the adhesive layer faces of the dielectric layer. The carrier substrate is removed. A patterned metal layer is formed on a region exposed by the patterned photoresist layer. The patterned photoresist layer is removed. The adhesive layer is removed.

4 Claims, 7 Drawing Sheets

(51) Int. Cl.
*H05K 3/06* (2006.01)
*G03F 7/16* (2006.01)
*G03F 7/20* (2006.01)
*H05K 1/11* (2006.01)
*H05K 3/00* (2006.01)
*H05K 3/46* (2006.01)
*G03F 7/00* (2006.01)

(52) U.S. Cl.
CPC ............ *H05K 1/115* (2013.01); *H05K 3/0023* (2013.01); *H05K 3/06* (2013.01); *H05K 3/108* (2013.01); *H05K 3/465* (2013.01); *H05K 3/4644* (2013.01); *H05K 2201/091* (2013.01); *H05K 2203/0108* (2013.01); *H05K 2203/0369* (2013.01); *H05K 2203/0502* (2013.01); *H05K 2203/0548* (2013.01); *H05K 2203/0562* (2013.01); *Y10T 29/49124* (2015.01); *Y10T 29/49155* (2015.01)

(58) Field of Classification Search
USPC ......... 29/830, 840, 841, 852, 846, 825, 829, 29/835; 32/428, 901, 209, 214
See application file for complete search history.

(56) References Cited

U.S. PATENT DOCUMENTS

2005/0060886 A1 3/2005 Tsukahara et al.
2012/0295435 A1 11/2012 Yoneda

\* cited by examiner

MANUFACTURING METHOD OF CIRCUIT BOARD

CROSS-REFERENCE TO RELATED APPLICATION

This application claims the priority benefit of U.S. provisional application Ser. No. 62/309,930, filed on Mar. 17, 2016. The entirety of the above-mentioned patent application is hereby incorporated by reference herein and made a part of this specification.

BACKGROUND OF THE INVENTION

Field of the Invention

The invention relates to a manufacturing method of a circuit board, and more particularly, to a manufacturing method of a circuit board fixing a patterned photoresist layer using an adhesive layer.

Description of Related Art

Nano-imprint lithography (NIL) is a technique for manufacturing fine circuits and is extensively applied in the LED and OLED industries. NIL includes pressing a mold prototype having a pattern (generally referred to as mold, stamp, or template) on a photoresist material to mechanically deform the mold prototype so as to precisely transfer a fine pattern. Therefore, once the manufacture of the mold is complete, a fine structure such as a nano structure can be repeatedly molded in a simple manner, and manufacturing costs and the production of harmful waste in the manufacture can be effectively reduced. As a result, NIL has been expected to be applied in various areas in recent years.

However, after NIL transfers a pattern to a photoresist material, comprehensive exposure needs to be performed, and therefore the patterned photoresist layer to be formed and unnecessary residual photoresist material are both exposed to light. As a result, the residual photoresist layer cannot be removed by a developing solution in a simple manner. Therefore, unnecessary residual photoresist material needs to be removed using inductively-coupled plasma (ICP) or reactive ion etching (RIE), such that the photoresist pattern to be formed is readily damaged and the process yield is poor. Moreover, if the thickness of unnecessary residual photoresist material is too great, then the residual photoresist material may not be completely removed using ICP or RIE.

Moreover, since the size of the fine circuit continues to be reduced, the resulting patterned photoresist layer often has the issue of falling or collapsing due to the small size, and therefore process yield is affected.

SUMMARY OF THE INVENTION

The invention provides a manufacturing method of a circuit board in which a patterned photoresist layer is fixed using an adhesive layer.

The manufacturing method of a circuit board of the invention includes the following steps. A carrier substrate is provided. A patterned photoresist layer is formed on the carrier substrate. An adhesive layer is formed on the top surface of the patterned photoresist layer. A dielectric substrate is provided. A circuit pattern and a dielectric layer covering the circuit pattern are formed on the dielectric substrate, wherein the dielectric layer has an opening exposing a portion of the circuit pattern. The adhesive layer is adhered to the dielectric layer in a direction that the adhesive layer faces the dielectric layer. The carrier substrate is removed. A patterned metal layer is formed on a region exposed by the patterned photoresist layer. The patterned photoresist layer is removed. The adhesive layer is removed.

In an embodiment of the manufacturing method of a circuit board of the invention, the adhesive layer is, for instance, removed by applying a mechanical force.

In an embodiment of the manufacturing method of a circuit board of the invention, the adhesive layer is, for instance, a thermal-sensitive adhesive layer, and the method further includes, after the patterned photoresist layer is removed and before the adhesive layer is removed, performing UV irradiation, laser irradiation, or infrared heating on the adhesive layer.

In an embodiment of the manufacturing method of a circuit board of the invention, the method of forming the patterned photoresist layer on the carrier substrate includes the following steps. A photoresist material layer is formed on the carrier substrate. An imprinting process is performed on the photoresist material layer via a stamp. An exposure process is performed on the imprinted photoresist material layer. The stamp is removed.

In an embodiment of the manufacturing method of a circuit board of the invention, the method further includes, after the dielectric layer is formed and before the adhesive layer is adhered to the dielectric layer, forming a conductive seed layer on a portion of the circuit pattern exposed by the opening and on the dielectric layer, and further including, after the adhesive layer is removed, removing the conductive seed layer below the adhesive layer.

The manufacturing method of a circuit board of the invention includes the following steps. A dielectric substrate is provided. A circuit pattern and a dielectric layer covering the circuit pattern are formed on the dielectric substrate, wherein the dielectric layer has an opening exposing a portion of the circuit pattern. An adhesive layer is formed on the dielectric layer, and the adhesive layer seals the opening. A patterned photoresist layer is formed on the adhesive layer, and the patterned photoresist layer exposes the adhesive layer above the opening. The adhesive layer exposed by the patterned photoresist layer is removed. A patterned metal layer is formed on a region exposed by the patterned photoresist layer. The patterned photoresist layer is removed. The adhesive layer is removed.

In an embodiment of the manufacturing method of a circuit board of the invention, the adhesive layer is, for instance, a thermal-sensitive adhesive layer, and the method further includes, after the patterned photoresist layer is formed and before the adhesive layer exposed by the patterned photoresist layer is removed, performing UV irradiation, laser irradiation, or infrared heating on the adhesive layer exposed by the patterned photoresist layer.

In an embodiment of the manufacturing method of a circuit board of the invention, the method further includes, after the patterned photoresist layer is removed and before the adhesive layer is removed, performing UV irradiation, laser irradiation, or infrared heating on the adhesive layer.

In an embodiment of the manufacturing method of a circuit board of the invention, the method further includes, after the dielectric layer is formed and before the adhesive layer is formed, forming a conductive seed layer on a portion of a circuit pattern exposed by the opening and on the dielectric layer, and further including, after the adhesive layer is removed, removing the conductive seed layer below the adhesive layer.

Based on the above, in the invention, a patterned photoresist layer is firmly formed on a film layer below via an adhesive layer, and therefore the patterned photoresist layer can be effectively prevented from falling or collapsing. Therefore, the adhesion of the photoresist material is less influential in the selection of a photoresist material, such that the selection of the photoresist material is more flexible.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In each of the embodiments below, a patterned photoresist layer can be firmly located on a film layer below via an adhesive layer. Therefore, when the size of the circuit continues to be smaller, the resulting patterned photoresist layer can be firmly located on a film layer below without the issue of falling or collapsing.

First Embodiment

FIG. 1A to FIG. 1G are cross-sectional schematics of the manufacturing process of a circuit board shown according to the first embodiment of the invention. First, referring to FIG. 1A, a photoresist material layer 102 is formed on a carrier substrate 100. The carrier substrate 100 is, for instance, a glass substrate, a copper clad laminate, a Si laminate, or a ceramic laminate. In the present embodiment, the photoresist material layer 102 is a photoresist material layer curied after UV irradiation, but the invention is not limited thereto. Moreover, in the present embodiment, a release layer 104 can further be formed between the carrier substrate 100 and the photoresist material layer 102. The release layer 104 can facilitate the separation of a patterned photoresist layer formed by the photoresist material layer 102 and the carrier substrate 100 in a subsequent process.

Figure 1A:
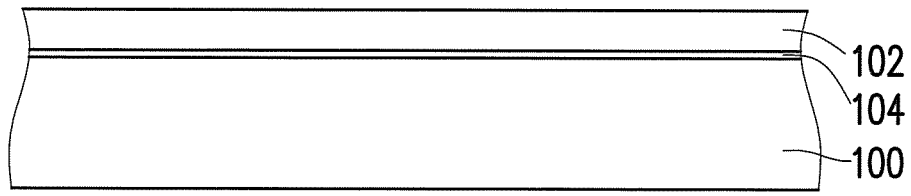
FIG. 1A to FIG. 1G are cross-sectional schematics of the manufacturing process of a circuit board shown according to the first embodiment of the invention.
Figure 1B:
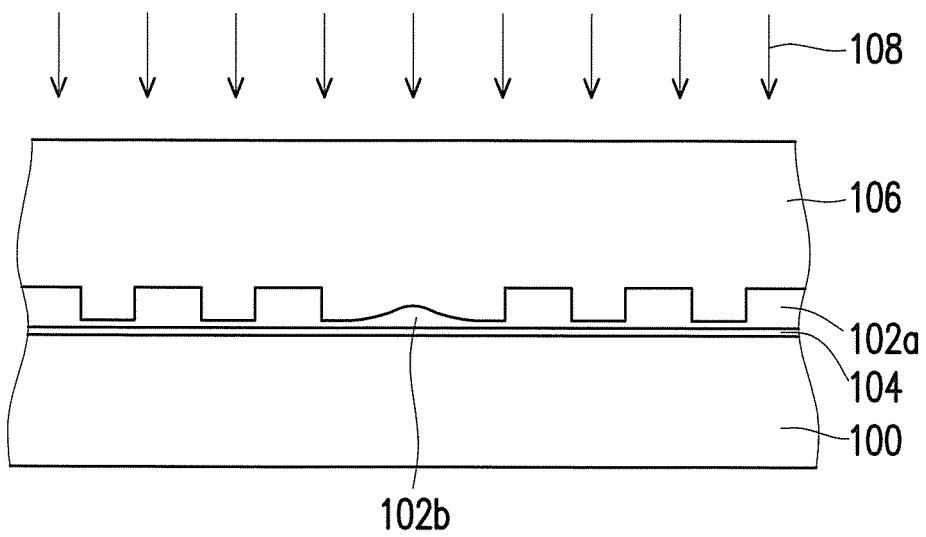

Next, referring to FIG. 1B, an imprinting process is performed on the photoresist material layer 102 via a stamp 106. The stamp 106 has a pattern corresponding to the circuit pattern to be formed. When the stamp 106 is pressed on the photoresist material layer 102, the photoresist material layer 102 can be deformed, such that a pattern is precisely transferred to the photoresist material layer 102. When the imprinting process is performed, a very thin and unavoidable photoresist residue is generally formed between the stamp 106 and the release layer 104. In particular, for the large contact area between the stamp 106 and the release layer 104, the very thin and unavoidable photoresist residue is largely concentrated in the center of the contact region, and the thickness distribution thereof shows a roughly Gaussian distribution from the periphery to the center, as shown in a photoresist residue 102b in FIG. 2B. Next, an exposure process is performed on the imprinted photoresist material layer 102 to form a patterned photoresist layer 102a. In the present embodiment, comprehensive irradiation is performed on the imprinted photoresist material layer 102 using a UV light 108. When the UV light 108 passes through the stamp 106 and is irradiated on the photoresist material layer 102, a cross-linking reaction can occur to the photoresist material layer 102 such that the photoresist material layer 102 is curied.

Figure 1C:
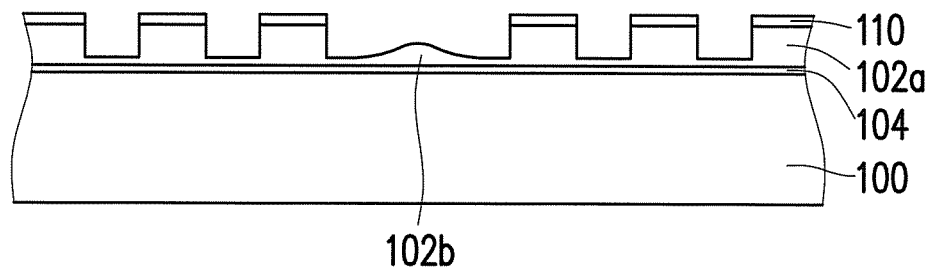

Next, referring to FIG. 1C, the stamp 106 is removed. At this point, the patterned photoresist layer 102a is formed on the release layer 104, and the photoresist residue 102b remains on the release layer 104 exposed by the patterned photoresist layer 102a. Next, an adhesive layer 110 is formed on the top surface of the patterned photoresist layer 102a. In the present embodiment, the adhesive layer 110 is, for instance, formed on the top surface of the patterned photoresist layer 102a via a spray coating process. The adhesive layer 110 can be a regular adhesive layer removed via a method of applying a mechanical force (such as artificial peeling) in a subsequent process. Alternatively, the adhesive layer 110 can be a thermal-sensitive adhesive layer for which the adhesion is significantly reduced such that the adhesive layer 110 is readily removed when heated to high temperature (such as greater than 100° C.) by UV irradiation, laser irradiation, or infrared heating.

Next, the carrier substrate 100 on which the patterned photoresist layer 102a is Ruined is adhered to a dielectric substrate on which a circuit pattern is formed. Details are provided below.

Figure 1D:
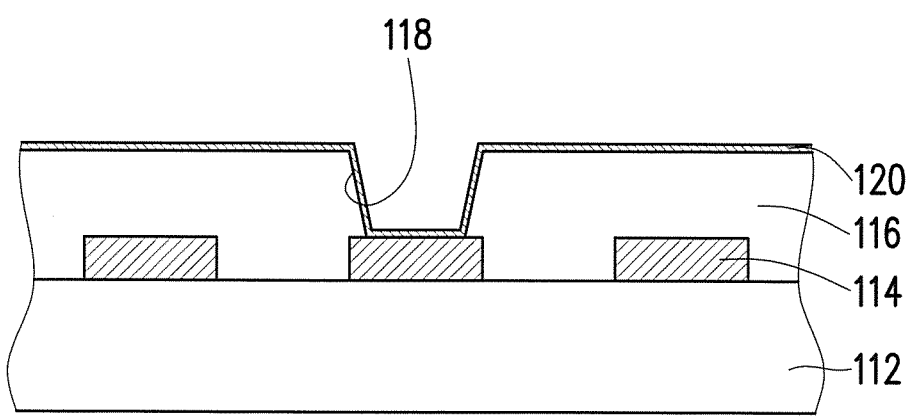

Referring to FIG. 1D, a circuit pattern 114 is formed on a dielectric substrate 112. The material of the dielectric substrate 112 is, for instance, epoxy resin, glass fiber cloth, or ceramic. The material of the circuit pattern 114 is, for instance, copper. Next, a dielectric layer 116 is formed on the dielectric substrate 112. The dielectric layer 116 covers the circuit pattern 114 on the dielectric substrate 112. The material of the dielectric layer 116 is, for instance, epoxy resin. The dielectric layer 116 is, for instance, formed on the dielectric substrate 112 via a lamination method. Next, an opening 118 exposing a portion of the circuit pattern 114 is formed in the dielectric layer 116. The forming method of the opening 118 includes, for instance, performing laser drilling or mechanical drilling. In the present embodiment, after the opening 118 is formed, a conductive seed layer 120 is formed on a portion of the circuit pattern 114 exposed by the opening 118 and on the dielectric layer 116. The material of the conductive seed layer 120 is, for instance, copper.

Figure 1E:
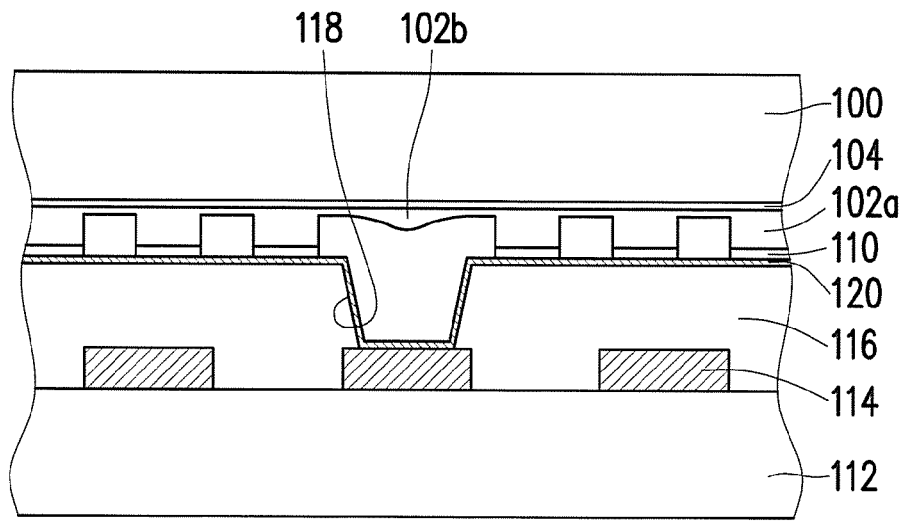

Next, referring to FIG. 1E, the adhesive layer 110 is adhered to the conductive seed layer 120 via precision alignment in a direction that the adhesive layer 110 faces the dielectric layer 116. By adhering the adhesive layer 110 to the conductive seed layer 120, the patterned photoresist layer 102a is formed on the conductive seed layer 120 on the dielectric layer 116, and the region exposed by the patterned photoresist layer 102a is the region in which a circuit pattern is subsequently formed. In the present embodiment, the patterned photoresist layer 102a exposes a portion of the conductive seed layer 120 on the dielectric layer 116 and the opening 118.

Figure 1F:
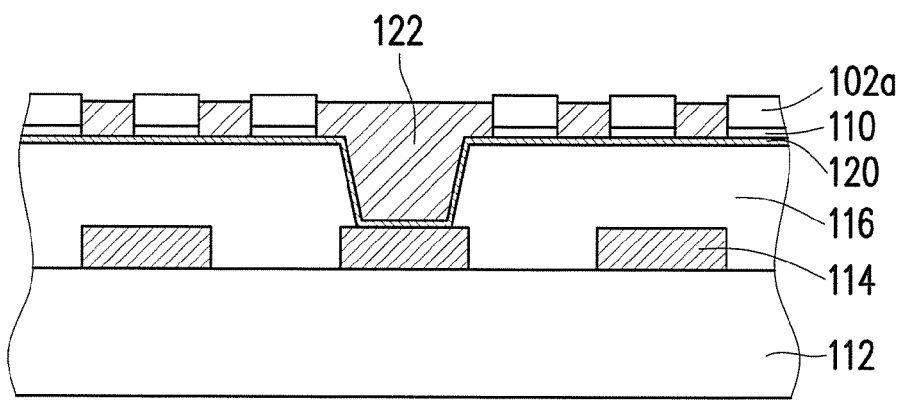

Next, referring to FIG. 1F, the carrier substrate 100 is removed. In the present embodiment, since the release layer 104 is formed on the carrier substrate 100, the carrier substrate 100 can be readily separated from the patterned photoresist layer 102a via the release layer 104. At this point, the photoresist residue 102b remaining on the release layer 104 can also be removed. After the carrier substrate 100 and the patterned photoresist layer 102a are separated, the patterned photoresist layer 102a is formed on the dielectric layer 116, and the patterned photoresist layer 102a is firmly formed on the dielectric layer 116 via the adhesive layer 110 below the patterned photoresist layer 102a. As a result, even if the patterned photoresist layer 102a has high aspect ratio, the patterned photoresist layer 102a can still be firmly located on the dielectric layer 116 without falling or collapsing. In other words, in the present embodiment, the patterned photoresist layer 102a can be firmly formed on the dielectric layer 116 via the adhesive layer 110, and therefore the selection of the photoresist material can be more flexible and the adhesion of the photoresist material is less influential. Next, a patterned metal layer 122 is formed on the conductive seed layer 120 exposed by the patterned photoresist layer 102a. The material of the patterned metal layer 122 is, for instance, copper. The forming method of the patterned metal layer 122 includes, for instance, performing an electroplating process using the conductive seed layer 120.

Figure 1G:
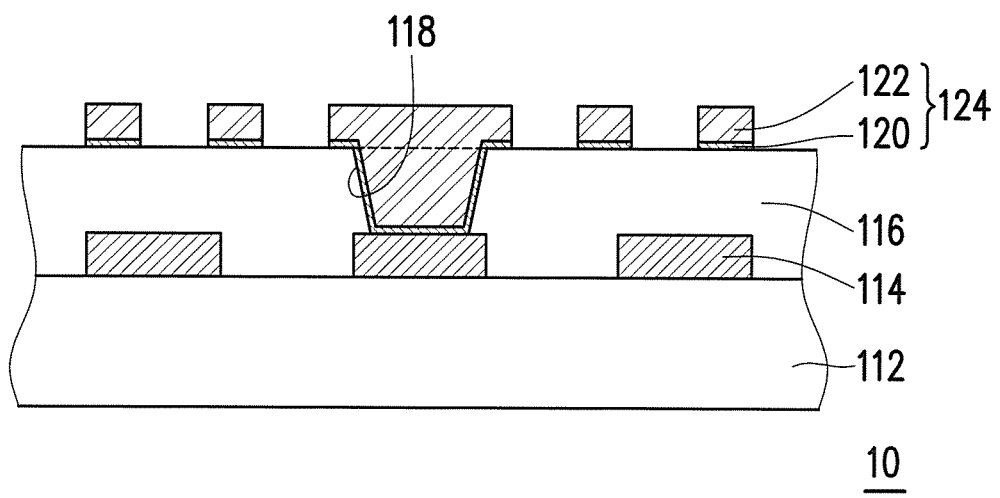

Next, referring to FIG. 1G, the patterned photoresist layer 102a is removed. The method of removing the patterned photoresist layer 102a includes, for instance, performing a wet peeling process. Next, the adhesive layer 110 below the patterned photoresist layer 102a is removed. As described above, when the adhesive layer 110 is a regular adhesive layer, the adhesive layer 110 can be removed via a method of applying a mechanical force (such as artificial peeling). Alternatively, when the adhesive layer 110 is a thermal-sensitive adhesive layer, after the patterned photoresist layer 102a is removed, UV irradiation, laser irradiation, or infrared heating is performed on the adhesive layer 110 below the patterned photoresist layer 102a to heat the adhesive layer 110 to high temperature (such as greater than 100° C.) such that the adhesion thereof is significantly reduced, and then the adhesive layer 110 is removed. In this way, the manufacture of a circuit board 10 of the present embodiment is complete. In the circuit board 10, the patterned metal layer 122 on the dielectric layer 116 and the conductive seed layer 120 below the patterned metal layer 122 form a circuit pattern 124, and the patterned metal layer 122 and the conductive seed layer 120 in the opening 118 form a conductive via connecting the circuit pattern 124 and the circuit pattern 114.

Second Embodiment

FIG. 2A to FIG. 2E are cross-sectional schematics of the manufacturing process of a circuit board shown according to the second embodiment of the invention. First, referring to FIG. 2A, a circuit pattern 202a is formed on a first surface 200a of a dielectric substrate 200, and a circuit pattern 202b is formed on a second surface 200b of the dielectric substrate 200. The material of the dielectric substrate 200 is, for instance, epoxy resin, glass fiber cloth, or ceramic. The material of the circuit patterns 202a and 202b is, for instance, copper. Then, a dielectric layer 204a is formed on the first surface 200a and a dielectric layer 204b is Ruined on the second surface 200b. The dielectric layer 204a covers the circuit pattern 202a on the first surface 200a and the dielectric layer 204b covers the circuit pattern 202b on the second surface 200b. The material of the dielectric layers 204a and 204b is, for instance, epoxy resin. The dielectric layers 204a and 204b are, for instance, respectively formed on the first surface 200a and the second surface 200b via a lamination method. Next, an opening 206a exposing a portion of the circuit pattern 202a is formed in the dielectric layer 204a and an opening 206b exposing a portion of the circuit pattern 202b is formed in the dielectric layer 204b. The forming method of the openings 206a and 206b includes, for instance, performing laser drilling or mechanical drilling. In the present embodiment, after the openings 206a and 206b are formed, a conductive seed layer 208a is formed on a portion of the circuit pattern 202a exposed by the opening 206a and on the dielectric layer 204a, and a conductive seed layer 208b is formed on a portion of the circuit pattern 202b exposed by the opening 206b and on the dielectric layer 204b. The material of the conductive seed layers 208a and 208b is, for instance, copper.

Figure 2A:
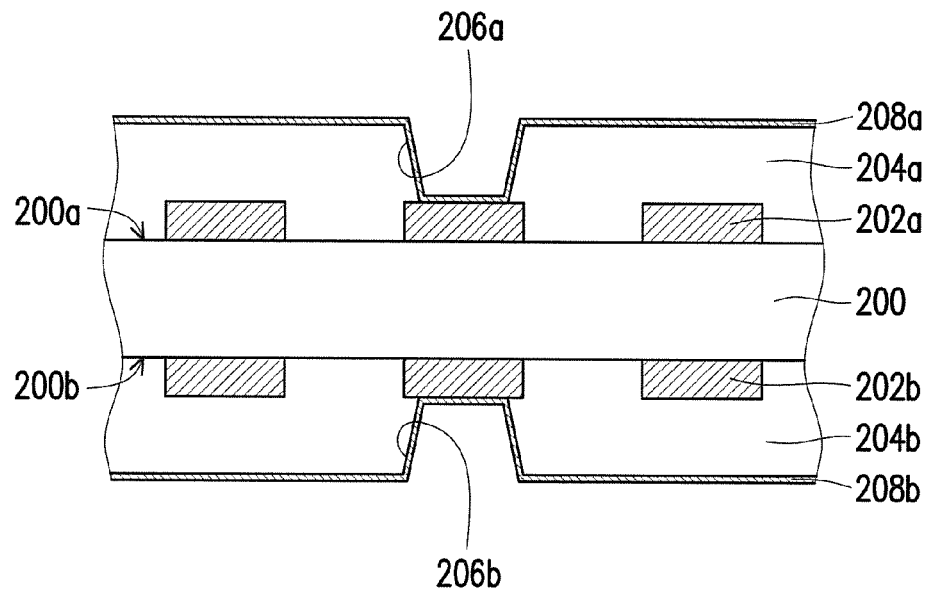
FIG. 2A to FIG. 2E are cross-sectional schematics of the manufacturing process of a circuit board shown according to the second embodiment of the invention.
Figure 2B:
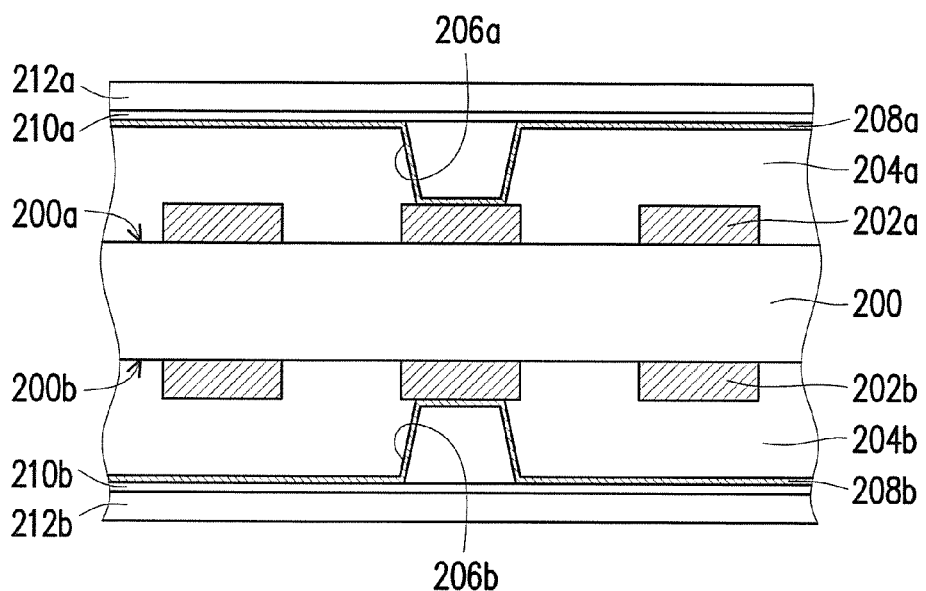

Next, referring to FIG. 2B, an adhesive layer 210a is formed on the conductive seed layer 208a and the adhesive layer 210a seals the opening 206a, and an adhesive layer 210b is formed on the conductive seed layer 208b and the adhesive layer 210b seals the opening 206b. The adhesive layers 210a and 210b can be thermal-sensitive adhesive layers for which the adhesion is significantly reduced such that the adhesive layers 210a and 210b are readily removed when heated to high temperature (such as greater than 100° C.) by UV irradiation, laser irradiation, or infrared heating. Next, a photoresist material layer 212a is formed on the adhesive layer 210a and a photoresist material layer 212b is formed on the adhesive layer 210b. In the present embodiment, the photoresist material layers 212a and 212b are photoresist material layers curied after UV irradiation, but the invention is not limited thereto.

Figure 2C:
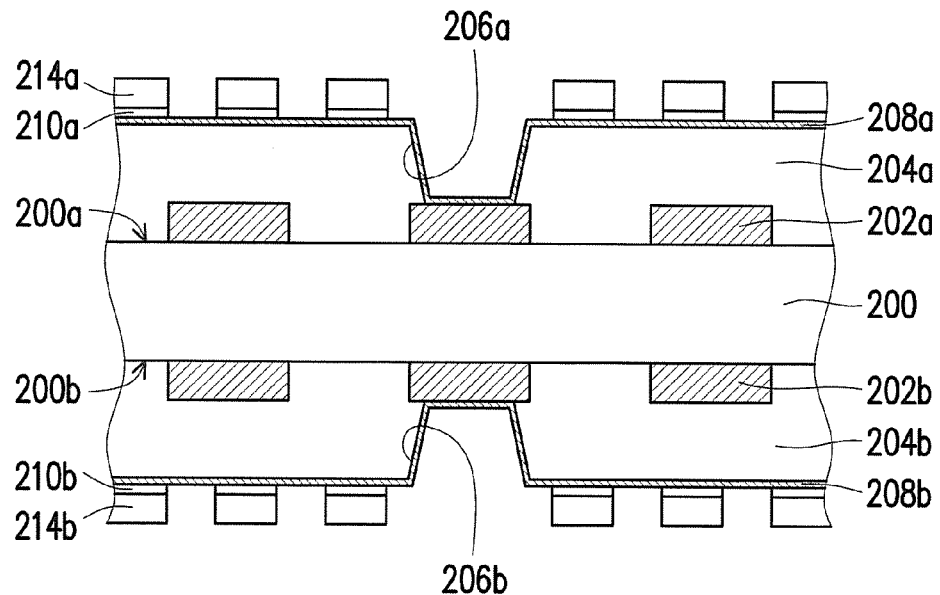

Next, referring to FIG. 2C, an exposure process and a developing process are performed on the photoresist material layers 212a and 212b to form patterned photoresist layers 214a and 214b. Next, the adhesive layer 210a exposed by the patterned photoresist layer 214a is removed and the adhesive layer 210b exposed by the patterned photoresist layer 214b is removed. As described above, when the adhesive layers 210a and 210b are thermal-sensitive adhesive layers, UV irradiation, laser irradiation, or infrared heating is performed on the adhesive layer 210a exposed by the patterned photoresist layer 214a and the adhesive layer 210b exposed by the patterned photoresist layer 214b to heat the adhesive layers 210a and 210b to high temperature (such as greater than 100° C.) such that the adhesion thereof is significantly reduced, and then the adhesive layers 210a and 210b are removed. As a result, the patterned photoresist layer 214a is formed on the conductive seed layer 208a on the dielectric layer 204a, and the region exposed by the patterned photoresist layer 214a is the region in which a circuit pattern is subsequently formed. Moreover, the patterned photoresist layer 214b is formed on the conductive seed layer 208b on the dielectric layer 204b, and the region exposed by the patterned photoresist layer 214b is the region in which a circuit pattern is subsequently formed. In the present embodiment, the patterned photoresist layer 214a exposes a portion of the conductive seed layer 208a on the dielectric layer 204a and the opening 206a, and the patterned photoresist layer 214b exposes a portion of the conductive seed layer 208b on the dielectric layer 204b and the opening 206b. It should be mentioned that, the patterned photoresist layer 214a is finely formed on the dielectric layer 204a via the adhesive layer 210a below the patterned photoresist layer 214a, and the patterned photoresist layer 214b is firmly formed on the dielectric layer 204b via the adhesive layer 210b below the patterned photoresist layer 214b. As a result, even if the patterned photoresist layers 214a and 214b have high aspect ratio, the patterned photoresist layer 214a can still be firmly located on the dielectric layer 204a without falling or collapsing, and the photoresist layer 214b can still be firmly located on the dielectric layer 204b without falling or collapsing. In other words, in the present embodiment, the patterned photoresist layer 214a can be firmly formed on the dielectric layer 204a via the adhesive layer 210a and the patterned photoresist layer 214b can be firmly formed on the dielectric layer 204b via the adhesive layer 210b, and therefore the selection of the photoresist material can be more flexible and the adhesion of the photoresist material is less influential.

Figure 2D:
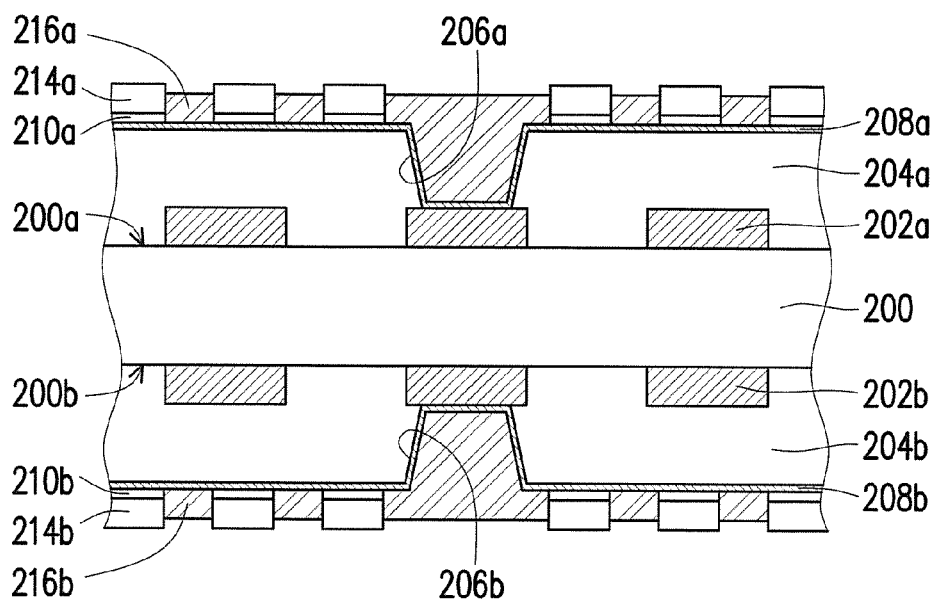

Next, referring to FIG. 2D, a patterned metal layer 216a is formed on the conductive seed layer 208a exposed by the patterned photoresist layer 214a, and a patterned metal layer 216b is formed on the conductive seed layer 208b exposed by the patterned photoresist layer 214b. The material of the patterned metal layers 216a and 216b is, for instance, copper. The forming method of the patterned metal layers 216a and 216b includes, for instance, performing an electroplating process using the conductive seed layers 208a and 208b.

Figure 2E:
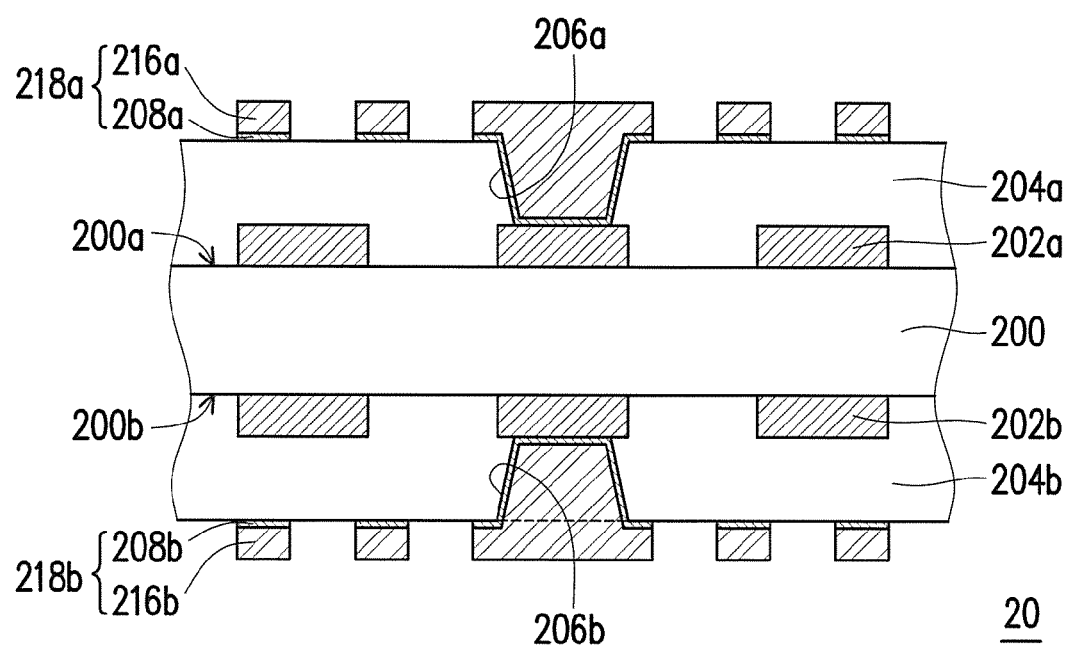

Next, referring to FIG. 2E, the patterned photoresist layers 214a and 214b are removed. The method of removing the patterned photoresist layers 214a and 214b includes, for instance, performing a wet peeling process. Next, the adhesive layer 210a below the patterned photoresist layer 214a is removed and the adhesive layer 210b below the patterned photoresist layer 214b is removed. As described above, when the adhesive layers 210a and 210b are thermal-sensitive adhesive layers, after the patterned photoresist layers 214a and 214b are removed, UV irradiation, laser irradiation, or infrared heating is performed on the adhesive layers 210a and 210b to heat the adhesive layers 210a and 210b to high temperature (such as greater than 100° C.) such that the adhesion thereof is significantly reduced, and then the adhesive layers 210a and 210b are removed. In this way, the manufacture of a circuit board 20 of the present embodiment is complete. In the circuit board 20, the patterned metal layer 216a on the dielectric layer 204a and the conductive seed layer 208a below the dielectric layer 204a foul' a circuit pattern 218a, and the patterned metal layer 216a and the conductive seed layer 208a in the opening 206a form a conductive via connecting the circuit pattern 218a and the circuit pattern 202a. Moreover, the patterned metal layer 216b on the dielectric layer 204b and the conductive seed layer 208b below the dielectric layer 204b form a circuit pattern 218b, and the patterned metal layer 216b and the conductive seed layer 208b in the opening 206b form a conductive via connecting the circuit pattern 218b and the circuit pattern 202b.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of a circuit board, comprising:
providing a dielectric substrate;
forming a circuit pattern on the dielectric substrate;
forming a dielectric layer covering the circuit pattern, wherein the dielectric layer has an opening exposing a portion of the circuit pattern;
forming an adhesive layer on the dielectric layer after forming the opening, wherein the adhesive layer seals the opening;
forming a patterned photoresist layer on the adhesive layer, wherein the patterned photoresist layer exposes the adhesive layer above the opening;
removing the adhesive layer exposed by the patterned photoresist layer;
forming a patterned metal layer on a region exposed by the patterned photoresist layer;
removing the patterned photoresist layer; and
removing the adhesive layer.

2. The manufacturing method of the circuit board of claim 1, wherein the adhesive layer is a thermal-sensitive adhesive layer, and the method further comprises, after the patterned photoresist layer is formed and before the adhesive layer exposed by the patterned photoresist layer is removed, performing UV irradiation, laser irradiation, or infrared heating on the adhesive layer exposed by the patterned photoresist layer.

3. The manufacturing method of the circuit board of claim 2, wherein the method further comprises, after the patterned photoresist layer is removed and before the adhesive layer is removed, performing UV irradiation, laser irradiation, or infrared heating on the adhesive layer.

4. The manufacturing method of the circuit board of claim 1, further comprising, after the dielectric layer is formed and before the adhesive layer is formed, forming a conductive seed layer on a portion of the circuit pattern exposed by the opening and on the dielectric layer, and further comprising, after the adhesive layer is removed, removing the conductive seed layer below the adhesive layer.

* * * * *